(12) United States Patent
Haraguchi et al.

(10) Patent No.: US 11,824,084 B2
(45) Date of Patent: Nov. 21, 2023

(54) POWER SEMICONDUCTOR DEVICE

(71) Applicant: Mitsubishi Electric Corporation, Tokyo (JP)

(72) Inventors: Yuki Haraguchi, Tokyo (JP); Fumihito Masuoka, Tokyo (JP); Ze Chen, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 38 days.

(21) Appl. No.: 17/403,016

(22) Filed: Aug. 16, 2021

(65) Prior Publication Data
US 2022/0130951 A1 Apr. 28, 2022

(30) Foreign Application Priority Data
Oct. 22, 2020 (JP) .................................. 2020-177308

(51) Int. Cl.
*H01L 29/06* (2006.01)

(52) U.S. Cl.
CPC ................................ *H01L 29/0623* (2013.01)

(58) Field of Classification Search
CPC ............... H01L 29/0638; H01L 29/405; H01L 29/8611; H01L 29/0611; H01L 29/0615; H01L 29/0619–0623; H01L 29/7811; H01L 29/7823; H01L 2924/12032; H01L 29/66143; H01L 29/66212; H01L 29/872; H01L 29/8725; H01L 51/0579; H01L 27/0766

See application file for complete search history.

(56) References Cited

U.S. PATENT DOCUMENTS 9,455,148 B2 * 9/2016 Masuoka .......... H01L 21/26513
2017/0154955 A1 6/2017 Harada et al.

FOREIGN PATENT DOCUMENTS

| JP | S62-011272 A | 1/1987 |
| JP | H03-169081 A | 7/1991 |
| JP | 6519455 B2 | 5/2019 |

* cited by examiner

*Primary Examiner* — Cuong B Nguyen
(74) *Attorney, Agent, or Firm* — Studebaker & Brackett PC

(57) ABSTRACT

An object of a technique of the present disclosure is to suppress reduction in withstand voltage in a power semiconductor device. A semiconductor base includes an n− type semiconductor substrate and at least one p type diffusion layer formed separately from each other on a surface layer on a side of a first main surface of the semiconductor substrate in a terminal region. A power semiconductor device includes at least one insulating film formed on a first main surface of the semiconductor base between an insulating film and the insulating film. A semi-insulating film has contact with the insulating film on the insulating film, and has contact with the first main surface in at least two regions where the insulating film is not formed between the insulating films.

7 Claims, 12 Drawing Sheets

POWER SEMICONDUCTOR DEVICE

BACKGROUND OF THE INVENTION

Field of the Invention

The present disclosure relates to a power semiconductor device.

Description of the Background Art

A power semiconductor device generally includes a cell region and a terminal region surrounding the cell region. A power semiconductor device includes a semi-insulating film connecting an electrode formed in a cell region and an electrode formed on an outer peripheral side of a terminal region in some cases. The semi-insulating film has a role of directly having contact with a surface of an Si semiconductor substrate in the terminal region to flow a carrier generated in the terminal region at a time of applying a reverse bias to the electrode. Accordingly, the carrier is prevented from being trapped by the insulating film, and also suppressed are a variation of a carrier concentration in a surface of a semiconductor substrate of a terminal region and inhibition of an extension of a depletion layer at the time of applying the reverse bias. As a result, leakage current is suppressed, and stability of withstand voltage is achieved (refer to Japanese Patent No. 6519455).

SUMMARY

However, the semi-insulating film has a fixed charge, thus there is a problem that the fixed charge varies the carrier concentration in the terminal region, thereby inhibiting the extension of the depletion layer at the time of applying the reverse bias and reducing the withstand voltage.

An object of a technique of the present disclosure is to suppress reduction in withstand voltage in a power semiconductor device.

A power semiconductor device according to the present disclosure is divided into a cell region and a terminal region surrounding the cell region in a plan view. The power semiconductor device includes a semiconductor base, a first insulating film, a second insulating film, a first electrode, a second electrode, and a semi-insulating film. The semiconductor base has a first main surface. The first insulating film is formed on the first main surface in an inner peripheral end portion of the terminal region. The second insulating film is formed on the first main surface in an outer peripheral end portion of the terminal region. The first electrode is formed on the first main surface and the first insulating film in the cell region. The second electrode is formed on the first main surface and the second insulating film in the outer peripheral end portion of the cell region. The semi-insulating film has contact with the first electrode, the second electrode, the first insulating film, and the second insulating film, and has contact with the first main surface between the first insulating film and the second insulating film. The semiconductor base includes a semiconductor substrate of a first conductivity type and at least one first diffusion layer of a second conductivity type. Each first diffusion layer is formed separately from each other on the surface on a side of the first main surface of the semiconductor substrate in the terminal region. The power semiconductor device further includes at least one third insulating film. The third insulating film is formed on the first main surface of the semiconductor base between the first insulating film and the second insulating film. The semi-insulating film has contact with the third insulating film on the third insulating film, and has contact with the first main surface in at least two regions where the third insulating film is not formed between the first insulating film and the second insulating film.

According to the power semiconductor device of the present disclosure, a contact area between a first main surface of the semiconductor base in the terminal region and the semi-insulating film is reduced. As a result, suppressed is a variation of a carrier concentration in an Si surface of the terminal region caused by a fixed charge of the semi-insulating film, and reduction in withstand voltage is suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

A first conductive type of a semiconductor is an n type and a second conductive type is a p type in the present specification. However, it is also applicable that the first conductive type is a p type and the second conductive type is an n type. Expressions of n– type, n type, n+ type, and n++ type indicate that an n type impurity concentration is low in an order of this description. That is to say, the n type has a larger n type impurity concentration than the n– type, and has a lower n type impurity concentration than the n+ type. The n+ type has a lower n type impurity concentration than the n++ type. This relationship of the impurity concentration also falls under expressions of p− type, p type, p+ type, and p++ type in a p-type impurity concentration.

A. Embodiment 1

<A-1. Configuration>

Figure 1:
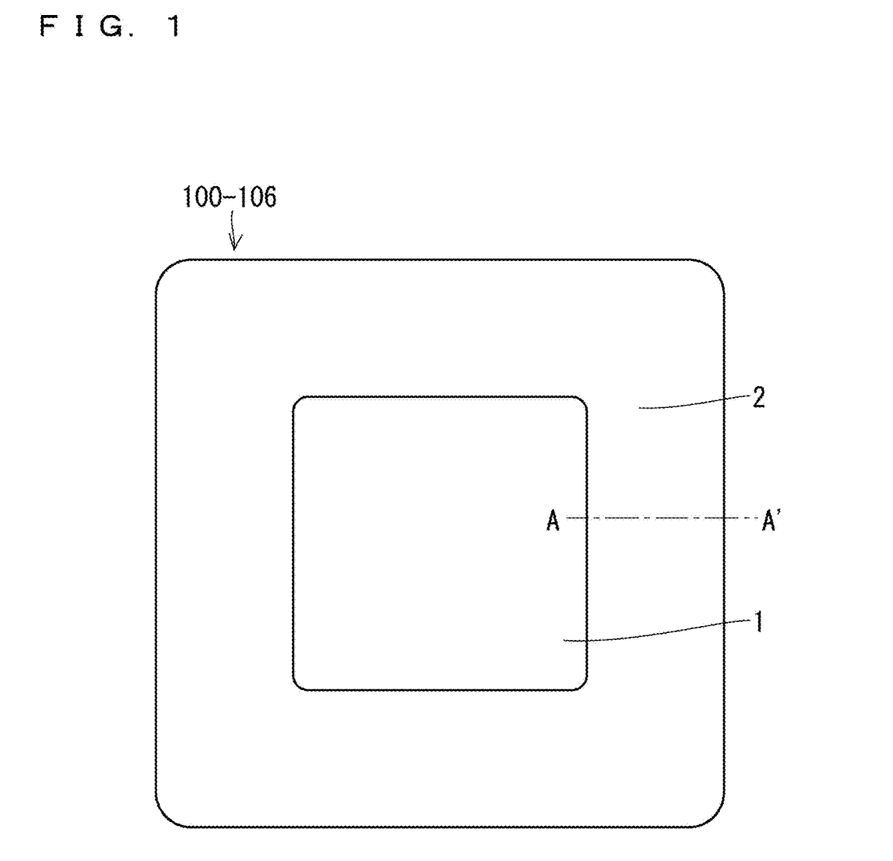
FIG. 1 is a plan view of a power semiconductor device.

FIG. 1 is a plan view of a power semiconductor device 101 according to an embodiment 1. The plan view illustrated in FIG. 1 is also used as a plan view of a power semiconductor device according to each embodiment described hereinafter and a power semiconductor device of a comparison example. As illustrated in FIG. 1, the power semiconductor device 101 includes a cell region 1 and a terminal region 2 surrounding the cell region 1.

Figure 2:
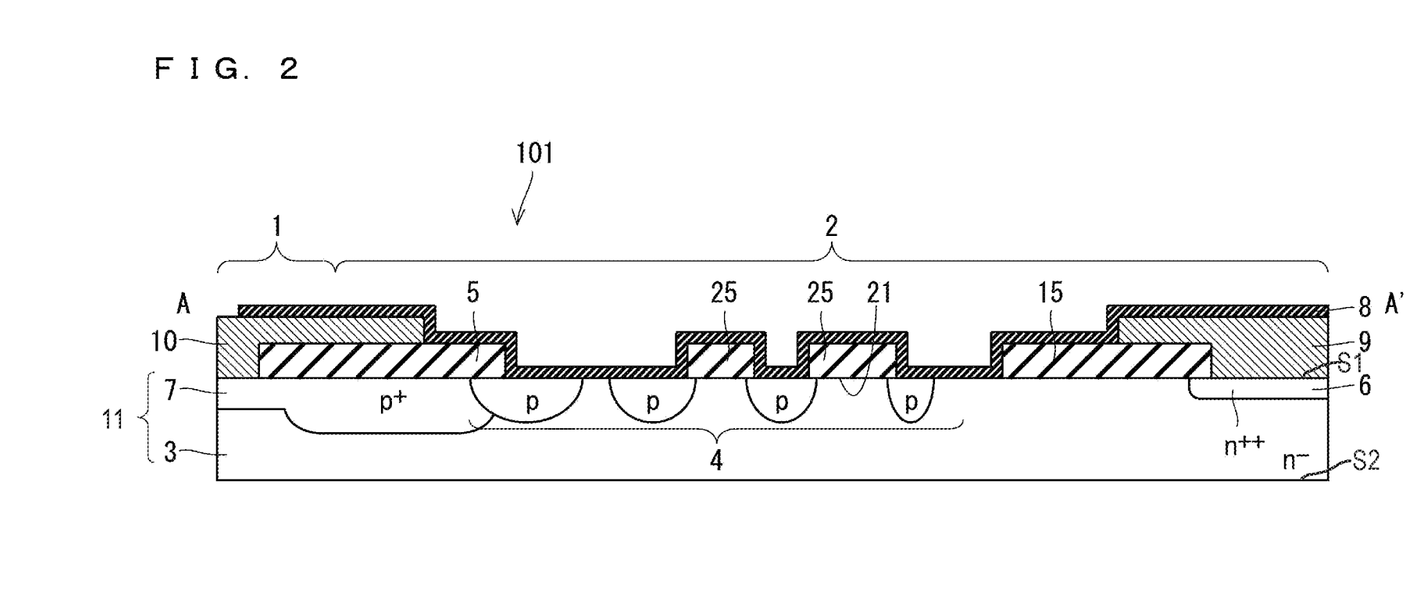
FIG. 2 is an A-A' cross-sectional view of a power semiconductor device according to an embodiment 1.

FIG. 2 is a cross-sectional view of the power semiconductor device 101 along an A-A' line in FIG. 1. As illustrated in FIG. 2, the power semiconductor device 101 is divided into the cell region 1 and the terminal region 2 in a plan view, and includes a n− type semiconductor substrate 3, at least one p type diffusion layer 4, insulating films 5 and 15, an n++ type diffusion layer 6, a p+ type diffusion layer 7, a semi-insulating film 8, and electrodes 9 and 10.

The n− type semiconductor substrate 3, at least one p type diffusion layer 4, the n++ type diffusion layer 6, and the p+ type diffusion layer 7 are collectively referred to as the semiconductor base 11. In FIG. 2, an upper surface of the semiconductor base 11 is referred to as a first main surface S1 and a lower surface of the semiconductor base 11 is referred to as a second main surface S2. That is to say, the semiconductor base 11 includes the first main surface S1 and the second main surface S2 on a side opposite to the first main surface S1. The first main surface S1 of the semiconductor base 11 is also referred to as an Si surface.

The semiconductor substrate 3 is an n− type Si substrate. At least one p type diffusion layer 4 is disposed on a surface layer on a side of the first main surface S1 of the semiconductor substrate 3 in the terminal region 2. When there are a plurality of p type diffusion layers 4, the plurality of p type diffusion layers 4 are disposed at intervals on the surface layer on the side of the first main surface S1 of the semiconductor substrate 3 in the terminal region 2. The p type diffusion layer 4 is also referred to as the first diffusion layer. The insulating film 5 as the insulating film is disposed on the first main surface S1 in a portion of a boundary with the cell region 1 in the terminal region 2. The insulating film 15 as the second insulating film is disposed on the first main surface S1 in an outer peripheral end portion of the terminal region 2. In this manner, the insulating films 5 and 15 are disposed on the first main surface S1 in both end portions of the terminal region 2.

The n++ type diffusion layer 6 as the second diffusion layer is disposed on the surface layer on the side of the first main surface S1 in the outer peripheral end portion of the terminal region 2. The p+ type diffusion layer 7 as a third diffusion layer is disposed on the surface layer on the side of the first main surface S1 in a portion of a boundary between the cell region 1 and the terminal region 2. The p type diffusion layer 4 located on an innermost peripheral side of the plurality of p type diffusion layers 4 is adjacent to an outer peripheral end portion of the p+ type diffusion layer 7. The plurality of p type diffusion layers 4, the n++ type diffusion layer 6, and the p+ type diffusion layer 7 are disposed to surround the cell region 1. The electrode 10 as a first electrode is disposed on the first main surface S1 in the cell region 1. The electrode 9 as a second electrode is disposed on the n++ type diffusion layer 6 and the insulating film 15. Each of the electrodes 9 and 10 is an Al electrode, for example.

The semi-insulating film 8 is disposed on the electrodes 9 and 10, the insulating films 5 and 15, and the first main surface S1 to connect the electrode 9 and the electrode 10. The semi-insulating film 8 has direct contact with the first main surface S1 in a region where an insulating film 25 described hereinafter is not formed between the insulating films 5 and 15 disposed on the both ends of the terminal region 2. According to this configuration, a carrier generated in the terminal region 2 at a time of applying a reverse bias flows to the electrodes 9 and 10 through the semi-insulating film 8, thus the carrier is prevented from being trapped by the insulating films 5 and 15. Suppressed accordingly are a variation of a carrier concentration in the first surface S1 of the terminal region 2 and inhibition of an extension of a depletion layer at the time of applying the reverse bias. As a result, leakage current is suppressed, and stability of withstand voltage is achieved.

The power semiconductor device 101 includes not only the insulating films 5 and 15 formed on the both ends of the terminal region 2 but also at least one insulating film 25 formed on the first main surface S1 between the two insulating films 5 and 15. The insulating film 25 is also referred to as a third insulating film.

The semi-insulating film 8 is disposed as follows in the terminal region 2 between the insulating films 5 and 15. That is to say, the semi-insulating film 8 is disposed on the insulating film 25 in a region where the insulating film 25 is disposed, and in other words, the semi-insulating film 8 is separated from the first main surface S1 with the insulating film 25 therebetween. The semi-insulating film 8 has direct contact with the first main surface S1 in a region where the insulating films 5, 15, and 25 are not disposed. At least one insulating film 25 is provided, thus the semi-insulating film 8 has contact with the first main surface S1 at two positions, at least. In the example in FIG. 2, the two insulating films 25 are illustrated, and the semi-insulating film 8 has contact with the first main surface S1 at three positions.

A region of the first main surface S1 sandwiched between the two p type diffusion layers 4 adjacent to each other in the semiconductor substrate 3 is referred to as a substrate exposed region 21. In the power semiconductor device 101, the insulating film 25 is formed to extend across at least one substrate exposed region 21 and an end portion region of the p type diffusion layers 4 adjacent to the both sides of the substrate exposed region 21. The insulating film 25 may not be formed on all the substrate exposed regions 21. In the example in FIG. 2, the insulating film 25 is not formed on the substrate exposed region 21 located on the innermost side.

A material having extremely small fixed charge such as oxide film, for example, is used for the insulating film 25.

Silicon nitride, for example, is applied to a material of the semi-insulating film 8. A method of forming the semi-insulating film 8 is plasma CVD, for example. According to plasma CVD, the semi-insulating film can be formed relatively easily.

A field limiting ring (FLR), a linearly-narrowed field limiting ring (LNFLR), or a multistage variation of lateral doping (VLD) or a structure of partially combining them, for example, can be adopted as the terminal region 2. FLR has a structure in which the p type diffusion layer 4 and the n type region of the semiconductor substrate 3 on an inner peripheral side of the p type diffusion layer 4 in the terminal region 2 constitute one unit and the units surrounding the cell region 1 are repetitively disposed at intervals. A width of the unit is constant, and a width of the p type diffusion layer 4 in each unit is linearly reduced toward an outer peripheral side of the terminal region 2.

LNFLR has a structure in which the p type diffusion layers 4 are repetitively disposed on the surface layer of the semiconductor substrate 3 in the terminal region 2 to surround the cell region 1. An interval between the p type diffusion layers 4 increases toward the outer peripheral side of the terminal region 2.

Multistage VLD has a structure in which the p type diffusion layers 4 are repetitively disposed on the surface layer of the semiconductor substrate 3 in the terminal region 2 to surround the cell region 1. An end portion of each p type diffusion layer 4 is connected to each other except for the outer peripheral end portion of the p type diffusion layer 4 on an outermost peripheral side of the terminal region 2. A surface concentration of each p type diffusion layer 4 decreases toward the outer periphery of the terminal region 2, and a depth of each p type diffusion layer 4 also decreases.

<A-2. Action>

According to the configuration of each embodiment, leakage current can be reduced and withstand voltage stability can be ensured while suppressing reduction in withstand voltage. A mechanism and an action thereof are described hereinafter.

Figure 3:
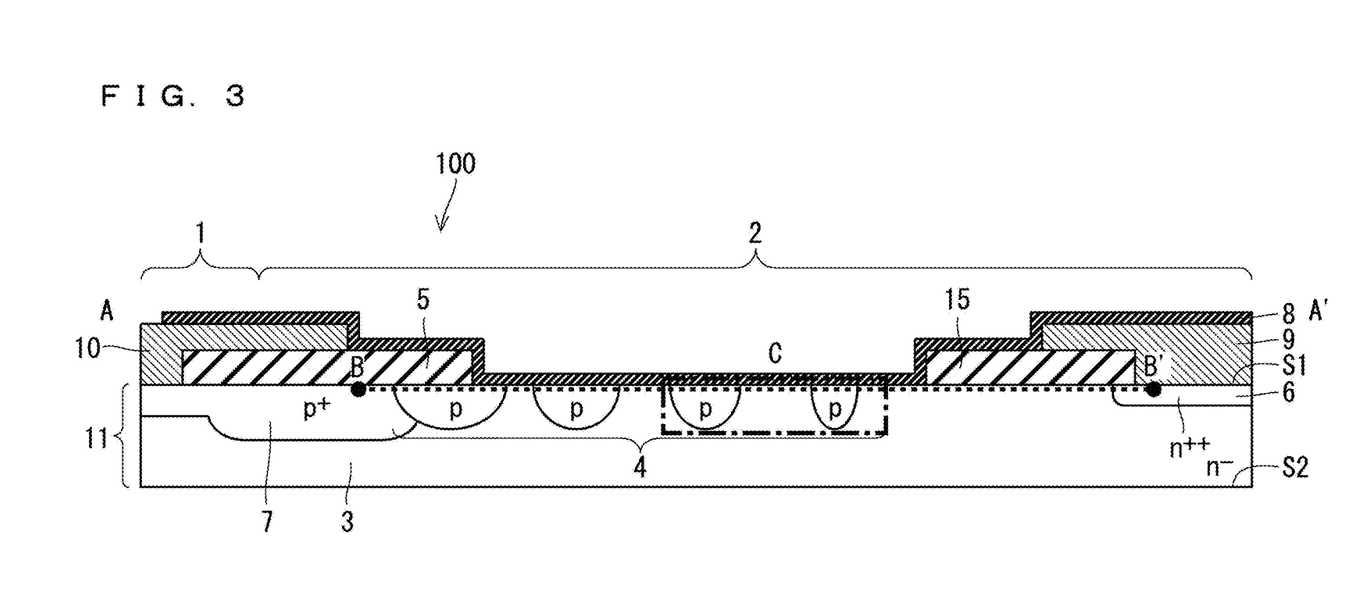
FIG. 3 is an A-A' cross-sectional view in FIG. 1 of a power semiconductor device of a comparison example.

A power semiconductor device 100 according to a comparison example is described firstly. FIG. 3 is a cross-sectional view of the power semiconductor device 100 of the comparison example along the A-A' line in FIG. 1. The power semiconductor device 100 of the comparison example has the same structure as the power semiconductor device 101 of the embodiment 1 except that the insulating film 25 is not formed on the first main surface S1 between the two insulating films 5 and 15.

When reverse bias is applied, a depletion layer extends from a side of the cell region 1 of the terminal region 2 toward the outer peripheral side in the power semiconductor device, and the withstand voltage is retained. In the power semiconductor device 100 of the comparison example illustrated in FIG. 3, the semi-insulating film 8 having the fixed charge covers the first main surface of the semiconductor base 11 in the terminal region 2, thus the carrier concentration of the first main surface of the semiconductor base 11 having contact with the semi-insulating film 8 gets high. Accordingly, an extension of the depletion layer toward the outer peripheral side of the terminal region 2 is inhibited, and a local high electrical field region is formed, thereby causing reduction in the withstand voltage.

Figure 4:
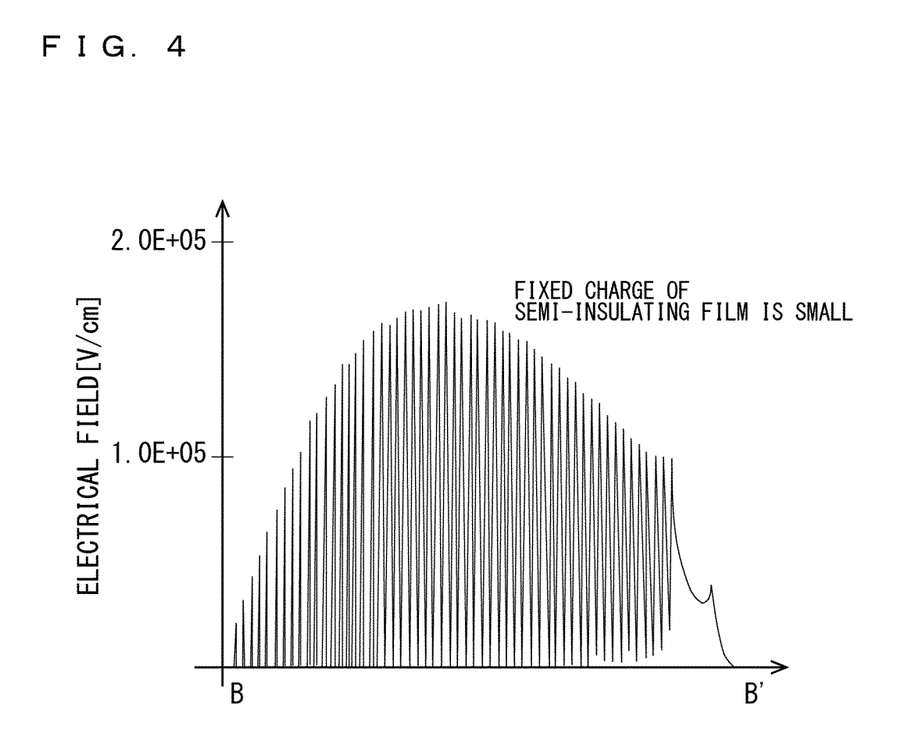
FIG. 4 is a drawing illustrating a simulation result of an electrical field distribution along a B-B' line in FIG. 3 of the power semiconductor device of the comparison example in a case where a semi-insulating film has a small fixed charge.
Figure 5:
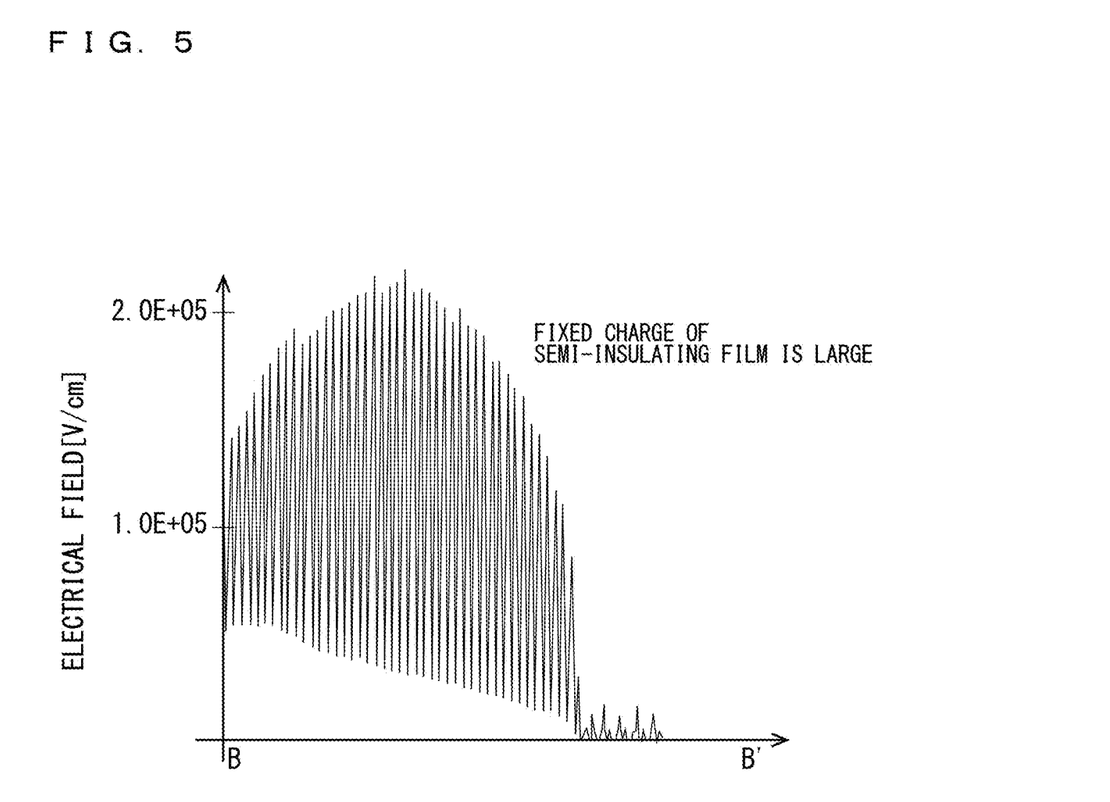
FIG. 5 is a drawing illustrating a simulation result of an electrical field distribution along the B-B' line in FIG. 3 of the power semiconductor device of the comparison example in a case where the semi-insulating film has a large fixed charge.

FIG. 4 and FIG. 5 illustrate a simulation result of an electrical field distribution in a B-B' cross section in FIG. 3 in case where the reverse bias is applied to the power semiconductor device 100 of the comparison example. FIG. 5 illustrates a case where the semi-insulating film 8 has large fixed charge compared with a case in FIG. 4. Recognized from the comparison between FIG. 4 and FIG. 5 is that when the semi-insulating film 8 has the large fixed charge, the depletion layer does not extend toward the outer peripheral side of the terminal region 2 compared with a case where the semi-insulating film 8 has small fixed charge, and an electrical field intensity peak gets high.

Figure 6:
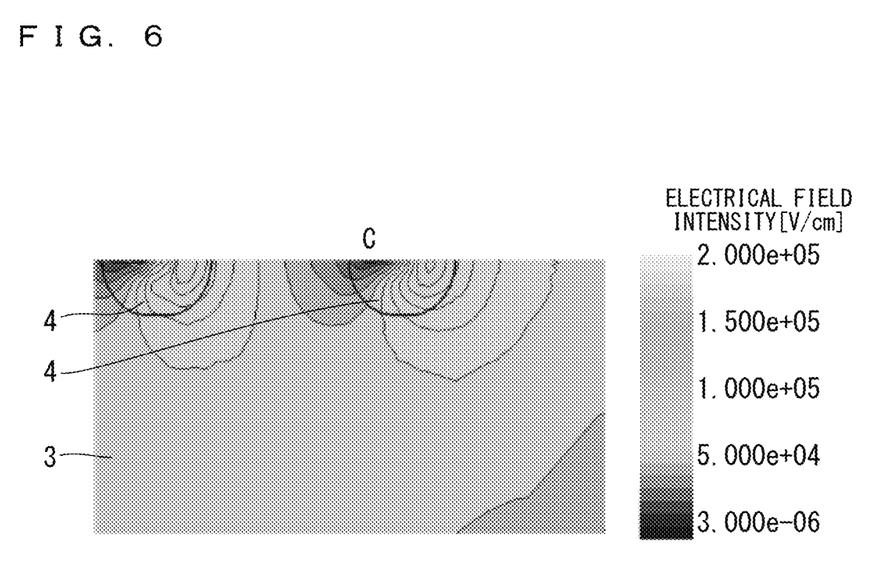
FIG. 6 is a drawing illustrating a simulation result of an electrical field distribution in a region C in FIG. 3 in the power semiconductor device of the comparison example.

FIG. 6 illustrates a simulation result of an electrical field distribution of the p type diffusion layer 4 and the semiconductor substrate 3 in a region C in FIG. 3 in a case where the reverse bias is applied to the power semiconductor device 100 of the comparison example. The region C is a neighborhood region of the first main surface S1 of the semiconductor base 11. Recognized from FIG. 6 is that a high electrical field occurs on the outer peripheral side of the p type diffusion layer 4, and the carrier is generated easily.

In contrast, the power semiconductor device 101 of the embodiment 1 includes the insulating film 25 on the first main surface S1 between the two insulating films 5 and 15, thus has an effect of suppressing a variation of a carrier concentration in the first main surface S1 of the terminal region 2, and as a result, suppressing the reduction in the withstand voltage while maintaining withstand voltage stability.

That is to say, the power semiconductor device 101 of the embodiment 1 is divided into the cell region 1 and the terminal region 2 surrounding the cell region 1 in a plan view, and includes the semiconductor base 11 having the first main surface S1, the insulating film 5 as the first insulating film formed on the first main surface S1 in the inner peripheral end portion of the terminal region 2, the insulating film 15 as the second insulating film formed on the first main surface S1 in the outer peripheral end portion of the terminal region 2, the electrode 10 as the first electrode formed on the first main surface S1 and the insulating film 5 in the cell region 1, the electrode 9 as the second electrode formed on the first main surface S1 and the insulating film 15 in the outer peripheral end portion of the terminal region 2, and the semi-insulating film 8 having contact with the electrodes 9 and 10 and the insulating films 5 and 15, and having contact with the first main surface S1 between the insulating films 5 and 15. The semiconductor base 11 includes the semiconductor substrate 3 of a first conductive type and at least one p type diffusion layer 4 as the first diffusion layer of a second conductive type formed separately from each other on the surface layer on the side of the first main surface S1 of the semiconductor substrate 3 in the terminal region 2. The power semiconductor device 101 further includes at least one insulating film 25 as the third insulating film formed on the first main surface S1 of the semiconductor base 11 between the insulating films 5 and 15. The semi-insulating film 8 has contact with the insulating film 25 on the insulating film 25, and has contact with the first main surface S1 in at least two regions where the insulating film 25 is not formed between the insulating films 5 and 15.

According to the above configuration, a contact area between the semi-insulating film 8 and the first main surface S1 of the semiconductor base 11 in the terminal region 2 is reduced in the power semiconductor device 101. As a result, a variation of a carrier concentration in the Si surface of the terminal region 2 caused by the fixed charge of the semi-insulating film 8 is suppressed, and the reduction in the withstand voltage is suppressed.

Figure 7:
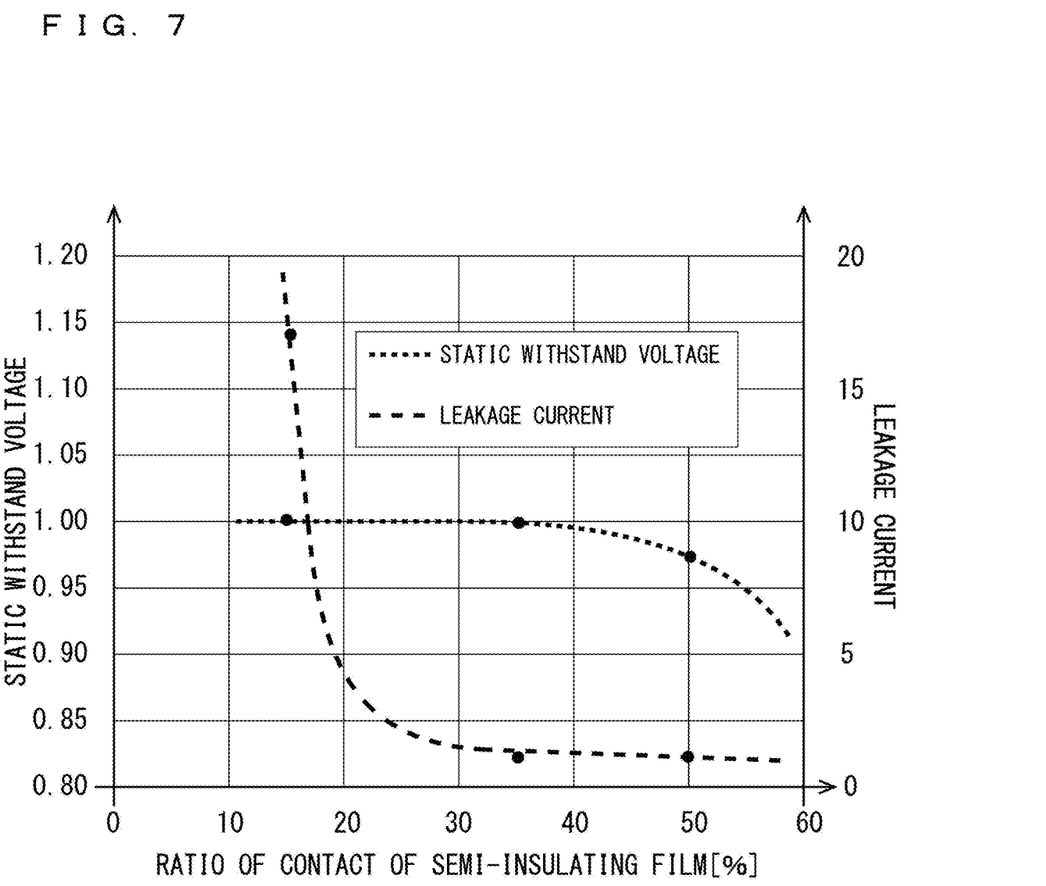
FIG. 7 is a drawing illustrating a relationship between a ratio of contact of the semi-insulating film and static withstand voltage and the ratio of contact of the semi-insulating film and leakage current.

FIG. 7 illustrates a relationship between a ratio of contact between the semi-insulating film 8 and the first main surface S1 of the terminal region 2 (also simply referred to as "the ratio of contact of the semi-insulating film 8" hereinafter) and static withstand voltage and between the ratio of contact therebetween and leakage current at a time of applying reverse bias for a long time. In FIG. 7, the static withstand voltage is normalized so as to have a maximum value of 1. The ratio of contact of the semi-insulating film 8 indicates a ratio of a contact region between the semi-insulating film 8 and the first main surface S1 of the terminal region 2 to a distance from the inner peripheral end portion of the p type diffusion layer 4 located in an innermost periphery of the terminal region 2 to the inner peripheral end portion of the electrode 9. When the ratio of contact of the semi-insulating film 8 is equal to or larger than 50%, the static withstand voltage decreases. When the ratio of contact of the semi-insulating film 8 is equal to or smaller than 15%, the leakage current after applying the reverse bias for a long time increases. Accordingly, the ratio of contact between the semi-insulating film 8 and the first main surface S1 of the terminal region 2 is preferably equal to or larger than 15% and equal to or smaller than 50%.

The semi-insulating film 8 needs to have constant conductivity to avoid a carrier trapping to the insulating film 5, and preferably has conductivity equal to or larger than $1.0 \times 10^8$ Ωcm and equal to or smaller than $1.0 \times 10^{12}$ Ωcm.

The action of the power semiconductor device 101 described in this section is also adopted to a power semiconductor device of the other embodiment described hereinafter.

B. Embodiment 2

Figure 8:
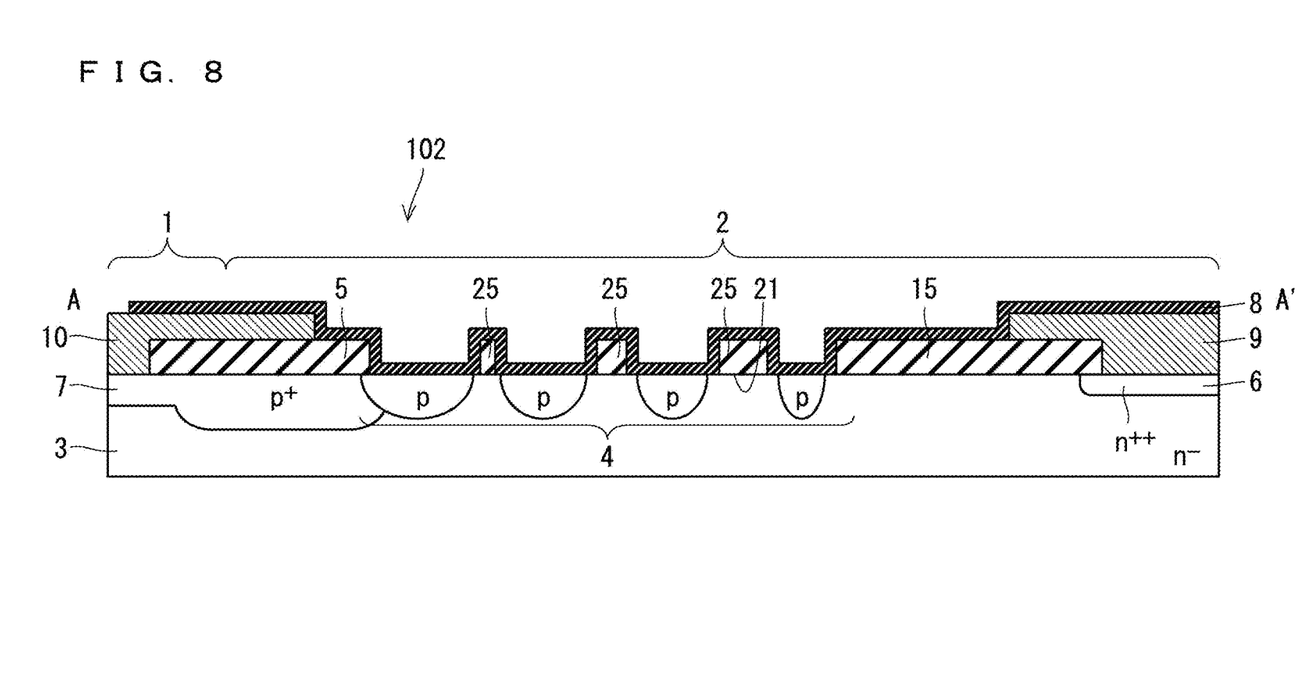
FIG. 8 is an A-A' cross-sectional view in FIG. 1 of a power semiconductor device according to an embodiment 2.

FIG. 8 is a cross-sectional view of a power semiconductor device 102 of an embodiment 2 along the A-A' line in FIG. 1. Only an arrangement of the insulating film 25 and a contact form of the semi-insulating film 8 with the semiconductor base 11 in accordance with the arrangement thereof are different between the power semiconductor device 102 and the power semiconductor device 101. Only a part of a configuration of the power semiconductor device 102 different from that of the power semiconductor device 101 is described hereinafter.

In the power semiconductor device 102, the insulating film 25 is formed on a region in the substrate exposed region 21 except for both end portions thereof having contact with the p type diffusion layer 4. Accordingly, the semi-insulating film 8 has contact with the p type diffusion layer 4 and an end portion of the substrate exposed region 21 having contact with the p type diffusion layer 4.

That is to say, in the power semiconductor device 102 of the embodiment 2, the semi-insulating film 8 has continuous contact with the p type diffusion layer 4 and part of the surface layer on the side of the first main surface S1 of the semiconductor substrate 3 having contact with the p type diffusion layer 4 on the both sides, and is separated from part of the surface layer on the side of the first main surface S1 of the semiconductor substrate 3 not having contact with the p type diffusion layer 4 with the insulating film 25 therebetween. In this manner, the contact region between the semi-insulating film 8 and the first main surface S1 of the semiconductor base is limited to the p type diffusion layer 4 and the part of the surface layer on the side of the first main surface S1 of the semiconductor substrate 3 having contact with the p type diffusion layer 4 on the both sides, and as a result, increased is an effect of suppressing the variation of the carrier concentration in the Si surface of the substrate exposed region 21 caused by the fixed charge of the semi-insulating film 8, and the reduction in the withstand voltage is suppressed.

C. Embodiment 3

Figure 9:
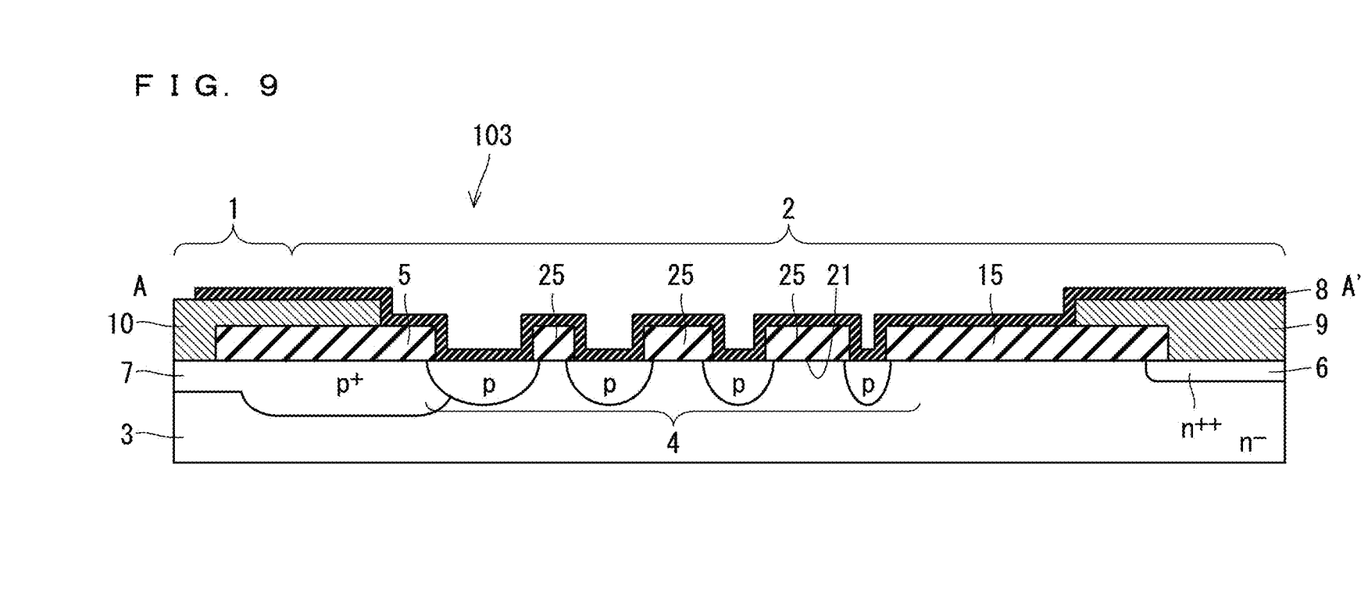
FIG. 9 is an A-A' cross-sectional view in FIG. 1 of a power semiconductor device according to an embodiment 3.

FIG. 9 is a cross-sectional view of a power semiconductor device 103 of an embodiment 3 along the A-A' line in FIG. 1. Only an arrangement of the insulating film 25 and a contact form of the semi-insulating film 8 with the semiconductor base 11 in accordance with the arrangement thereof are different between the power semiconductor device 103 and the power semiconductor device 101. Only a part of a configuration of the power semiconductor device 103 different from that of the power semiconductor device 101 is described hereinafter.

In the power semiconductor device 103, the insulating film 25 is formed to extend across all the substrate exposed regions 21 and the end portion region of the p type diffusion layers 4 adjacent to the both sides of the substrate exposed region 21. Accordingly, the semi-insulating film 8 has contact with only the p type diffusion layer 4 in the first main surface S1 of the semiconductor base 11, and does not have contact with the semiconductor substrate 3.

In the power semiconductor device 103 of the embodiment 3, the contact region between the semi-insulating film 8 and the first main surface S1 of the semiconductor base 11 in the terminal region 2 is limited to the p type diffusion layer 4. Accordingly, there is no contact region between the semi-insulating film 8 and the substrate exposed region 21 having contact with the p type diffusion layer 4. As a result, increased compared with the case in the embodiment 2 is an effect of suppressing the variation of the carrier concentration in the Si surface of the substrate exposed region 21 caused by the fixed charge of the semi-insulating film 8, and the reduction in the withstand voltage is suppressed.

D. Embodiment 4

Figure 10:
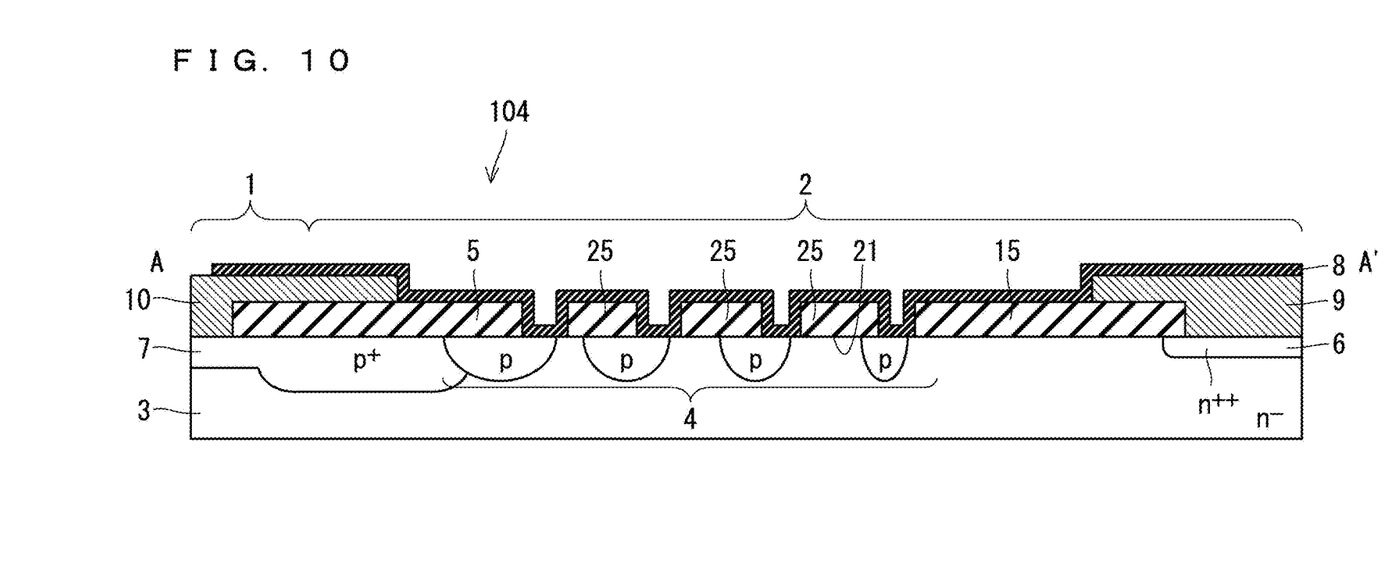
FIG. 10 is an A-A' cross-sectional view in FIG. 1 of a power semiconductor device according to an embodiment 4.

FIG. 10 is a cross-sectional view of a power semiconductor device 104 of an embodiment 4 along the A-A' line in FIG. 1. Only an arrangement of the insulating film 25 and a contact form of the semi-insulating film 8 with the semiconductor base 11 in accordance with the arrangement thereof are different between the power semiconductor device 104 and the power semiconductor device 101. Only a part of a configuration of the power semiconductor device 104 different from that of the power semiconductor device 101 is described hereinafter.

In the power semiconductor device 104, the insulating film 25 is formed to extend across a region in the substrate exposed region 21 except for an inner peripheral end portion thereof and a region of the inner peripheral end portion of the p type diffusion layer 4 having contact with that region in the substrate exposed region 21. Accordingly, the semi-insulating film 8 has continuous contact with the outer peripheral end portion of the p type diffusion layer 4 and only the part of the surface layer on the side of the first main surface S1 of the semiconductor substrate 3 having contact with the p type diffusion layer 4 in the first main surface S1 of the semiconductor base 11.

In the power semiconductor device 104 of the embodiment 4, the contact region between the semi-insulating film 8 and the first main surface S1 of the semiconductor base 11 in the terminal region 2 is limited to the outer peripheral end portion of the p type diffusion layer 4 and the part of the surface layer on the side of the first main surface S1 of the semiconductor substrate 3 having contact with the p type diffusion layer 4. Accordingly, the contact region between the semi-insulating film 8 and the substrate exposed region 21 decreases. As a result, suppressed is the variation of the carrier concentration in the Si surface of the substrate exposed region 21 caused by the fixed charge of the semi-insulating film 8, and the reduction in the withstand voltage is suppressed. The semi-insulating film 8 has contact with a high electrical field region formed in the outer peripheral end portion of the p type diffusion layer 4, thus suppressed is that the carrier generated in the high electrical field region flows to sides of the electrodes 9 and 10 through the semi-insulating film 8 and trapped to the insulating film 5, and withstand voltage stability is increased.

E. Embodiment 5

Figure 11:
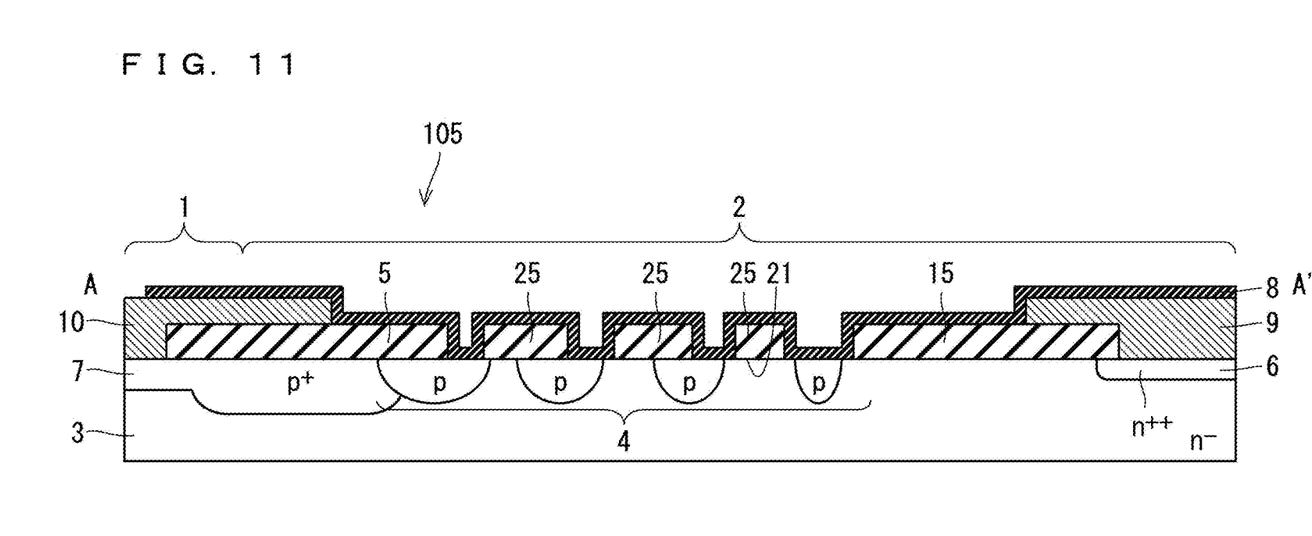
FIG. 11 is an A-A' cross-sectional view in FIG. 1 of a power semiconductor device according to an embodiment 5.

FIG. 11 is a cross-sectional view of a power semiconductor device 105 of an embodiment 5 along the A-A' line in FIG. 1. Only an arrangement of the insulating film 25 and a contact form of the semi-insulating film 8 with the semiconductor base 11 in accordance with the arrangement thereof are different between the power semiconductor device 105 and the power semiconductor device 101.

FIG. 11 illustrates the three insulating films 25. The insulating film 25 on a left side is disposed to extend across the substrate exposed region 21 and the end portion region of the p type diffusion layers 4 adjacent to the both sides of the substrate exposed region 21 as with the insulating film 25 in the embodiments 1 and 3. The insulating film 25 in a middle portion is formed to extend across the region in the substrate exposed region 21 except for the inner peripheral end portion thereof and the region of the inner peripheral end portion of the p type diffusion layers 4 having contact with that region in the substrate exposed region 21 as with the insulating film 25 in the embodiment 4. The insulating film 25 on a right side is formed on the region in the substrate exposed region 21 except for the both end portions thereof having contact with the p type diffusion layer 4 as with the insulating film 25 in the embodiment 2. In this manner, the embodiments 1 to 4 may be combined in the arrangement of the insulating film 25.

F. Embodiment 6

Figure 12:
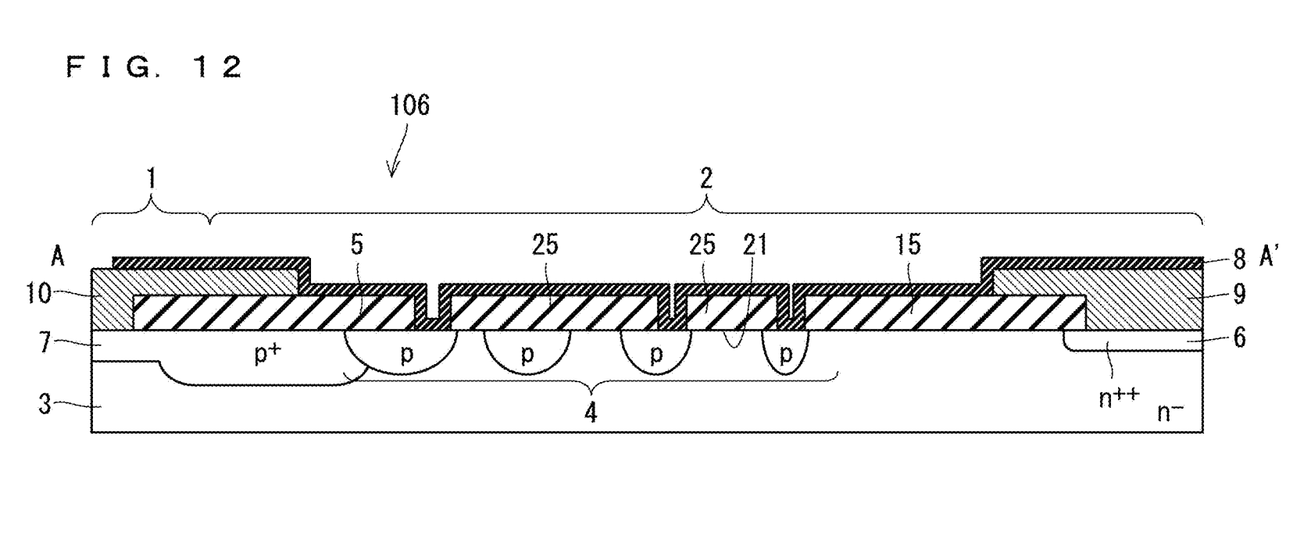
FIG. 12 is an A-A' cross-sectional view in FIG. 1 of a power semiconductor device according to an embodiment 6.

FIG. 12 is a cross-sectional view of a power semiconductor device 106 of an embodiment 6 along the A-A' line in FIG. 1. Only an arrangement of the insulating film 25 and a contact form of the semi-insulating film 8 with the semiconductor base 11 in accordance with the arrangement thereof are different between the power semiconductor device 106 and the power semiconductor device 101.

The semi-insulating film 8 may not have contact with at least one of the p type diffusion layers 4 disposed in the terminal region 2. In the example in FIG. 8, the second p type diffusion layer 4 from the left is covered by the insulating film 25, thus the semi-insulating film 8 does not have contact with that p type diffusion layer 4.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device divided into a cell region and a terminal region surrounding the cell region in a plan view, comprising:
   a semiconductor base having a first main surface;
   a first insulating film formed on the first main surface in an inner peripheral end portion of the terminal region;
   a second insulating film formed on the first main surface in an outer peripheral end portion of the terminal region;
   a first electrode formed on the first main surface and the first insulating film in the cell region;
   a second electrode formed on the first main surface and the second insulating film in the outer peripheral end portion of the terminal region; and
   a semi-insulating film having contact with the first electrode, the second electrode, the first insulating film, and the second insulating film, and having contact with the first main surface between the first insulating film and the second insulating film, wherein
   the semiconductor base includes:
   a semiconductor substrate of a first conductivity type; and
   at least one first diffusion layer of a second conductivity type formed on a surface layer on a side of the first main surface of the semiconductor substrate in the terminal region,
   the semiconductor base further includes at least one third insulating film formed on the first main surface of the semiconductor base between the first insulating film and the second insulating film, and
   the semi-insulating film has direct contact with the third insulating film, and has contact with the first main surface in at least two regions where the third insulating film is not formed between the first insulating film and the second insulating film.

2. The power semiconductor device according to claim 1, wherein the semiconductor base includes:
   a second diffusion layer of a first conductivity type formed on the surface layer on the side of the first main surface of the semiconductor substrate in the outer peripheral end portion of the terminal region, having contact with the second electrode, and having a higher first conductivity impurity concentration than the semiconductor base; and
   a third diffusion layer of a second conductivity type formed on a surface layer on the side of the first main surface of the semiconductor substrate in a portion of a boundary between the cell region and the terminal region, having contact with the first electrode, and having a higher second conductivity impurity concentration than the at least one first diffusion layer.

3. The power semiconductor device according to claim 1, wherein
   the semi-insulating film has continuous contact with the at least one first diffusion layer and part of the surface layer on the side of the first main surface of the semiconductor substrate having contact with the at least one first diffusion layer on both sides of the at least one diffusion layer, and
   the semi-insulating film is separated from part of the surface layer on the side of the first main surface of the semiconductor substrate not having contact with the at least one first diffusion layer with the third insulating film therebetween.

4. The power semiconductor device according to claim 1, wherein
   the contact of the semi-insulating film with the first main surface is only at the at least one first diffusion layer.

5. The power semiconductor device according to claim 1, wherein
   the semi-insulating film has continuous contact with an outer peripheral end portion of the at least one first diffusion layer and only part of the surface layer on the side of the first main surface of the semiconductor base having contact with the at least one first diffusion layer in the first main surface of the semiconductor substrate.

6. The power semiconductor device according to claim 1, wherein a ratio of a contact region between the semi-insulating film and the first main surface of the semiconductor base in the terminal region to a distance from an inner peripheral end portion of the first diffusion layer located in an innermost periphery of the terminal region to an inner peripheral end portion of the second electrode is equal to or larger than 15% and equal to or smaller than 50%.

7. The power semiconductor device according to claim 1, wherein resistivity of the semi-insulating film is equal to or larger than $1.0 \times 10^8$ Ωcm and equal to or smaller than $1.0 \times 10^{12}$ Ωcm.

* * * * *